US012604403B2

(12) United States Patent
Kunieda et al.

(10) Patent No.: US 12,604,403 B2
(45) Date of Patent: Apr. 14, 2026

(54) ELECTRONIC DEVICE

(71) Applicant: DENSO CORPORATION, Kariya-city (JP)

(72) Inventors: Hiroyoshi Kunieda, Kariya-city (JP); Yuichiro Sasaki, Kariya-city (JP); Masashi Hiramatsu, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 93 days.

(21) Appl. No.: 18/533,338

(22) Filed: Dec. 8, 2023

(65) Prior Publication Data

US 2024/0206067 A1 Jun. 20, 2024

(30) Foreign Application Priority Data

Dec. 15, 2022 (JP) ................................. 2022-200554

(51) Int. Cl.
 *H05K 1/14* (2006.01)
 *H05K 1/181* (2026.01)
(52) U.S. Cl.
 CPC ............. *H05K 1/141* (2013.01); *H05K 1/144* (2013.01); *H05K 1/181* (2013.01); *H05K 2201/0367* (2013.01); *H05K 2201/10189* (2013.01)
(58) Field of Classification Search
 CPC ........ H05K 1/141; H05K 1/144; H05K 1/181; H05K 2201/0367; H05K 2201/10189
 USPC ....................................................... 174/260
 See application file for complete search history.

(56) References Cited

U.S. PATENT DOCUMENTS

| | | | |
|---|---|---|---|
| 9,899,305 B1 | 2/2018 | Yeh et al. | |
| 2007/0178686 A1 | 8/2007 | Honda | |
| 2008/0150115 A1 | 6/2008 | Watanabe et al. | |
| 2009/0017613 A1 | 1/2009 | Honda | |
| 2009/0294962 A1* | 12/2009 | Hsu ................... H01L 23/49866 | |
| | | | 257/772 |
| 2011/0100696 A1* | 5/2011 | Nagamatsu .......... H05K 3/3452 | |
| | | | 174/261 |
| 2013/0162362 A1* | 6/2013 | Harima ................ H03H 9/1021 | |
| | | | 331/155 |
| 2022/0007510 A1 | 1/2022 | Kunieda et al. | |
| 2022/0310571 A1* | 9/2022 | Kunieda ............... H01L 23/562 | |

* cited by examiner

*Primary Examiner* — Andargie M Aychillhum
(74) *Attorney, Agent, or Firm* — Posz Law Group, PLC

(57) ABSTRACT

An electronic device includes first, second, and third circuit components, a reinforcing member, and electrical connectors. The second circuit component includes a surface on which the first circuit component mounts. The second circuit component is electrically connected to the first circuit component. The reinforcing member is in contact with the first circuit component and the surface of the second circuit component, and reinforces a connection between the first and second circuit components. The third circuit component has a mounting surface on which the second circuit component mounts, and is electrically connected the second circuit component. The electrical connectors include at least one electrical connecting portion establishing an electrical connection between the second circuit component and the third circuit component. At least one section of each of the electrical connectors is outside a member facing portion facing the reinforcing member.

7 Claims, 14 Drawing Sheets

FIG. 17
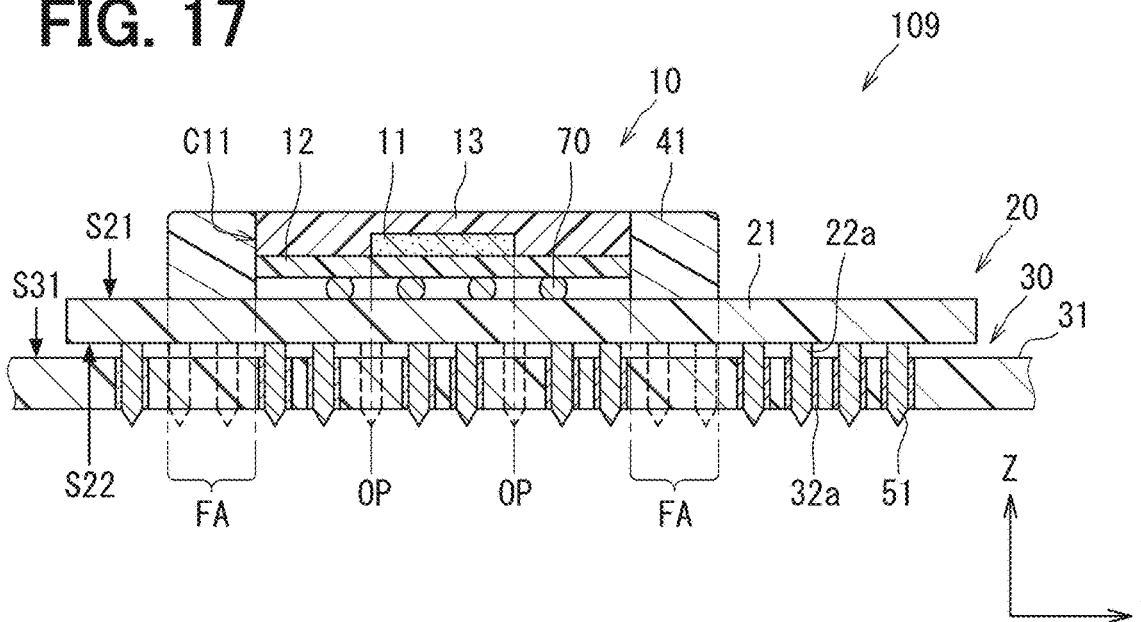
FIG. 18
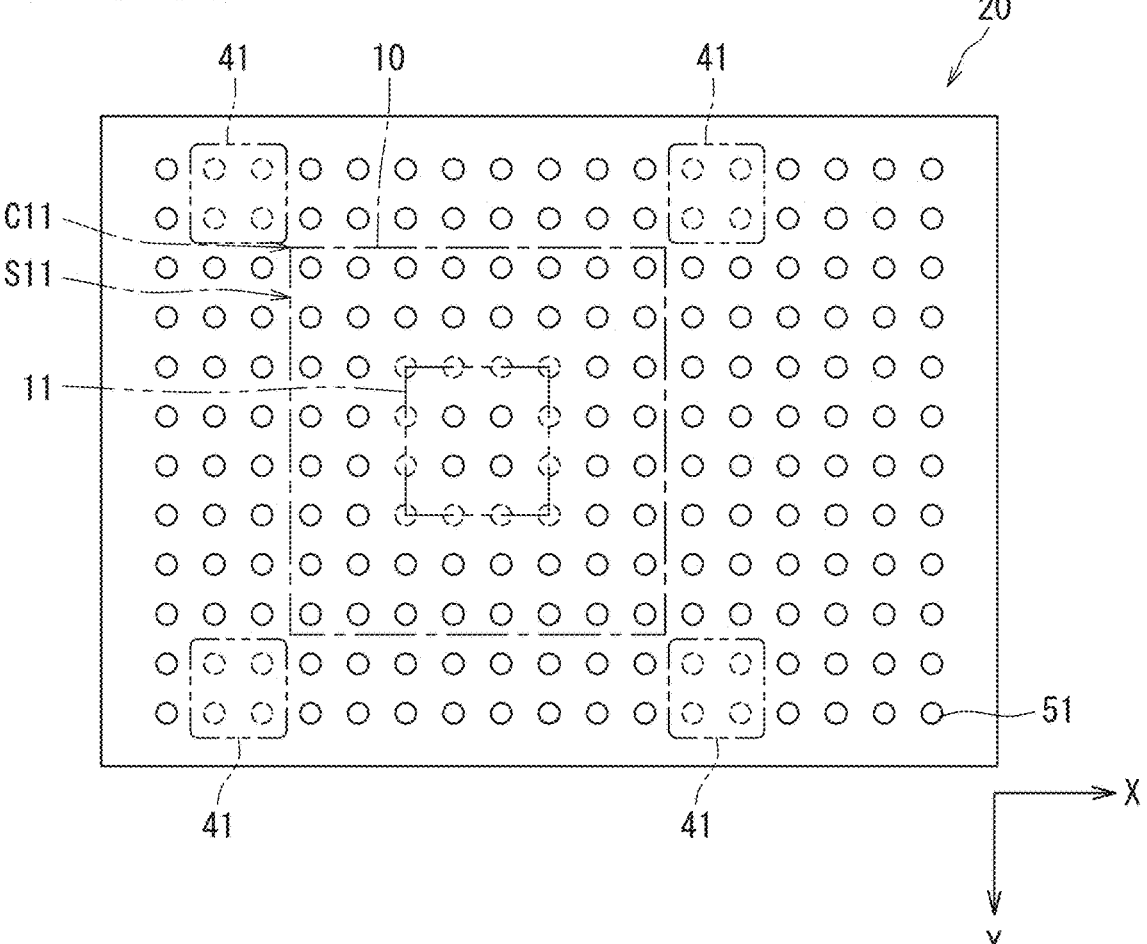

ELECTRONIC DEVICE

CROSS REFERENCE TO RELATED APPLICATION

This application is based on Japanese Patent Application No. 2022-200554 filed on Dec. 15, 2022, the disclosure of which is incorporated herein by reference.

TECHNICAL FIELD

The present disclosure relates to an electronic device.

BACKGROUND

In an electronic device, a lower integrated circuit (IC) package may mount on a printed circuit board; and an upper IC package may mount on the lower IC package.

SUMMARY

The present disclosure describes an electronic device that includes one or more circuit components, a reinforcing member, and multiple electrical connectors.

BRIEF DESCRIPTION OF DRAWINGS

FIG. 17 is a cross-sectional view illustrating a schematic configuration of an electronic device according to a ninth modification.

FIG. 18 is a plan view showing a schematic configuration of a sub-board according to the ninth modification on a facing surface side.

DETAILED DESCRIPTION

Figure 1:
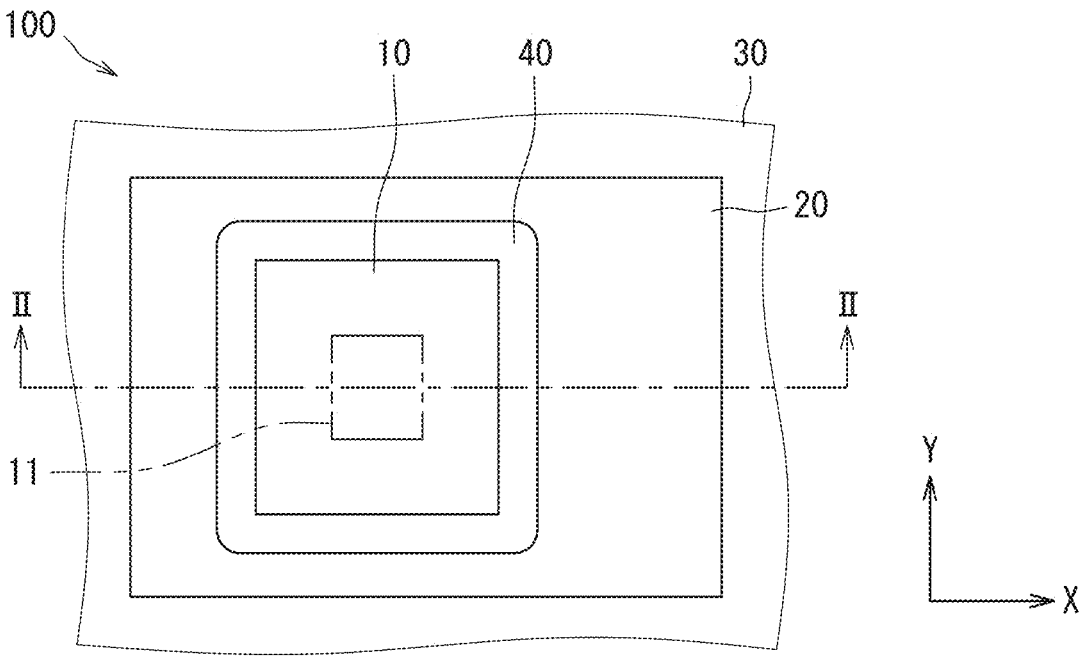
FIG. 1 is a plan view showing a schematic configuration of an electronic device according to an embodiment.

An electronic device may include reinforcing resin in order to ensure electrical connection reliability between a lower IC package and an upper IC package. For example, the reinforcing resin may be in contact with a front surface of the lower IC package and a side surface of the upper IC package. However, the reinforcing resin may deform as a temperature changes. Therefore, in the electronic device, stress due to deformation of the reinforcing resin may be applied to the electrical connection between the printed circuit board and the lower IC package. Therefore, the reliability of electrical connection of the electronic device may decrease. Thus, there may be a demand for further improvement to the electronic device.

According to an aspect of the present disclosure, an electronic device includes a first circuit component, a second circuit component, a third circuit component, a reinforcing member, and multiple electrical connectors. The second circuit component includes a surface on which the first circuit component mounts. The second circuit component electrically connects the first circuit component. The reinforcing member is made of resin as a major ingredient. The reinforcing member is in contact with the first circuit component and the surface of the second circuit component. The reinforcing member reinforces a connection between the first circuit component and the second circuit component. The third circuit component has a mounting surface on which the second circuit component mounts. The third circuit component electrically connects the second circuit component. The multiple electrical connectors include at least one electrical connecting portion located between the second circuit component and the third circuit component. The at least one electrical connecting portion establishes an electrical connection between the second circuit component and the third circuit component. At least one section of each of the plurality of electrical connectors is dislocated from a member facing portion of the reinforcing member. The member facing portion is a region facing the reinforcing member and is located between the second circuit component and the third circuit component.

As described above, each electrical connecting portion has at least one section dislocated from the member facing portion. Therefore, the electronic device can suppress stress from the reinforcing member due to the temperature change from being applied to the electrical connecting portion. Therefore, the electronic device can suppress decrease in electrical connection reliability between the second circuit component and the third circuit component.

Hereinafter, multiple embodiments of the present disclosure will be described with reference to the drawings. In each embodiment, portions corresponding to those described in the preceding embodiment are denoted by the same reference numerals, and redundant descriptions will be omitted in some cases. In each embodiment, in a case where only a part of the configuration is described, another preceding embodiment can be referenced to and applied to the other parts of the configuration. Hereinafter, three directions perpendicular to each other are denoted as an X-direction, a Y-direction, and a Z-direction.

First Embodiment

An electronic device according to a first embodiment will be described with reference to FIGS. 1 to 6. As shown in, for example, FIGS. 1, 2, an electronic device 100 includes an electronic component 10, a sub-board 20, and a main board 30. The electronic device 100 includes, for example, a reinforcing resin portion 40 and multiple first solders 50.

Figure 2:
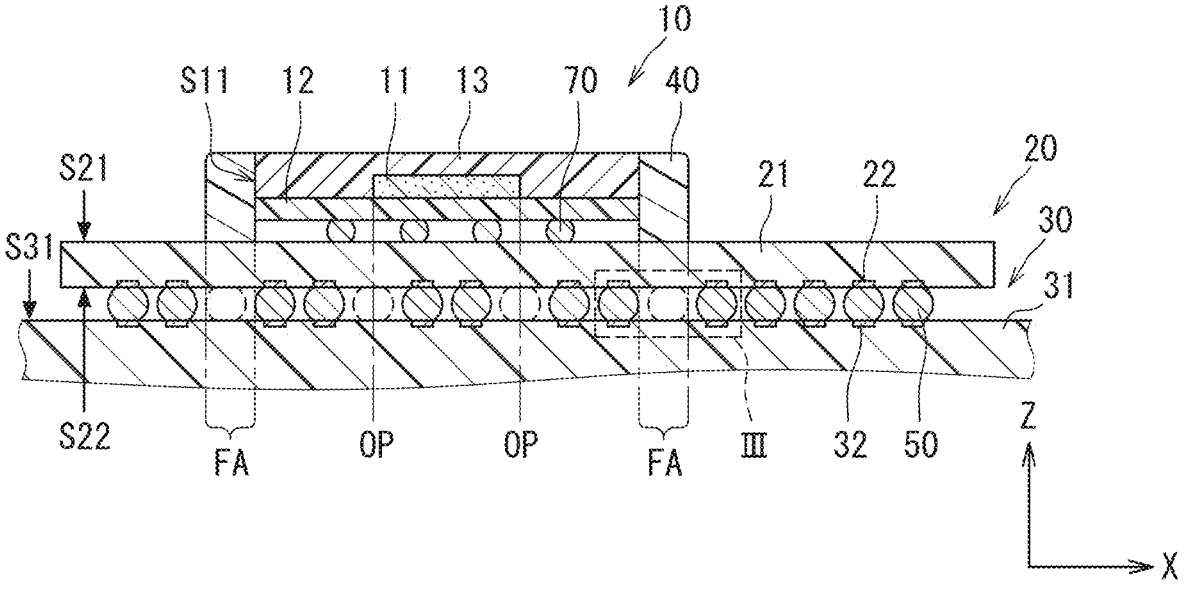
FIG. 2 is a cross-sectional view taken along a line II-II in FIG. 1.

As shown in FIG. 2, the electronic device 100 has the main board 30, the sub-board 20, and the electronic component 10 arranged in a stacking manner in the Z-direction. The electronic component 10 is mounted to face one surface S21 of the sub-board 20. The electronic component 10 is electrically connected to the sub-board 20 via second solder 70. The sub-board 20 is mounted to face a mounting surface S31 of the main board 30. Further, in the sub-board 20, a facing surface S22, which is on a side opposed from the one surface S21, is arranged to face the mounting surface S31. The sub-board 20 is electrically connected to the main board 30 via the first solder 50. The first solder 50 may also be called a first solder ball. The second solder 70 may also be called a second solder ball. The one surface S21 of the sub-board 20 may also be referred to as a first surface of the sub-board 20. The facing surface S22 of the sub-board 20 may also be referred to as a second surface of the sub-board 20.

The electronic device 100 is formed as a circuit by electrically connecting the electronic component 10, the sub-board 20, and the main board 30. The electronic device 100 can be applied to, for example, a controller. It can be said that the electronic device 100 includes the electronic component 10, the sub-board 20, and the main board 30 as circuit components that forms a circuit. In this embodiment, the electronic component 10 corresponds to a first circuit component, the sub-board 20 corresponds to a second circuit component, and the main board 30 corresponds to a third circuit component.

As shown in FIG. 1, the electronic component 10 is a circuit component smaller than the sub-board 20 and the main board 30. The sub-board 20 is a circuit component smaller than the main board 30. The term "smaller" described in the present disclosure means that the physical size is smaller when viewed in, for example, the Z-direction.
(Main Board)

The main board 30 is described with reference to, for example, FIGS. 2, 3. The main board 30 includes an electrically insulated base material 31 and conductive wiring portions 32 to 34 provided at the base material 31. Further, the main board 30 includes a mounting surface S31 on which the sub-board 20 mounts. The base material 31 is, for example, a board whose main component is resin. Therefore, the base material 31 can also be called a resin board. Moreover, the main board 30 can also be said to be a printed circuit board.

The wiring portions 32 to 34 include a wiring layer 34 and an interlayer connecting portion 33. The wiring layer 34 is stacked with the base material 31. The interlayer connecting portion 33 electrically connects different layers of the wiring layer 34. The wiring layer 34 is provided inside the base material 31 and on the surface of the base material 31. The wiring layer 34 is a portion exposed on the mounting surface S31 side, and includes a mounting surface land 32. The first solder 50 is connected to the mounting surface land 32. The mounting surface land 32 functions as an electrode for external connection. The term "for external connection" means that the main board 30 is used for connection with, for example, the sub-board 20 provided outside the main board 30. The main board 30 includes multiple mounting surface lands 32. The mounting surface land 32 corresponds to a mounting surface electrode.

The main board 30 may include a board-side protective film that covers a portion of the base material 31 and a portion of each of the wiring portions 32 to 34. The board-side protective film covers a portion of the base material 31 and a portion of the wiring portions 32 to 34 for the purpose of protection against adhesion of dust and damage.

A portion of the base material 31 is a surface on the mounting surface S31 side, and is a section where the wiring portions 32 to 34 are not provided. A section of the wiring portion 32 to 34 is a section of the wiring layer 34 included in the wiring portions 32 to 34. A section of the wiring layer 34 is provided on the mounting surface S31 side, and is a section excluding the mounting surface land 32. That is, the substrate side protective film covers the wiring layer 34 provided on the mounting surface S31 side of the base material 31 so that the mounting surface land 32 is exposed. The mounting surface land 32 is a portion exposed from the base material 31 and the substrate side protective film included in the wiring layer 34.

In this embodiment, the main board 30 is a multilayer board in which the wiring layers 34 are stacked. However, the present disclosure is not only limited to the above example. The main board 30 can also be called a wiring board or a mother board.
(Sub-Board)

Figures 3, 4:
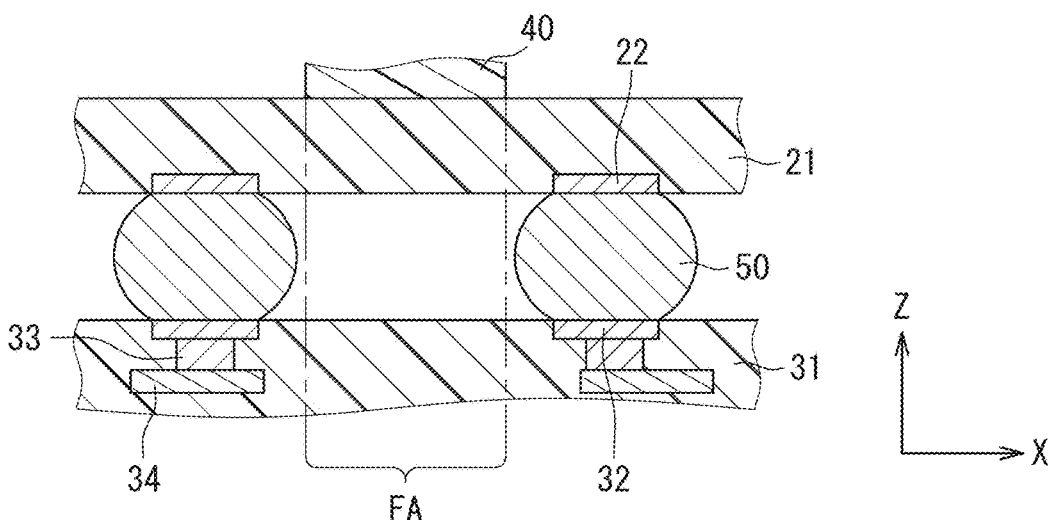
FIG. 3 is an enlarged view of a portion III in FIG. 2.
FIG. 4 is a plan view showing a schematic configuration of a sub-board on a facing surface side.

As shown in FIGS. 2, 3, the sub-board 20 includes electrically insulated base material 21 and a conductive facing surface land 22. The sub-board 20 includes one surface S21 on which the electronic component 10 mounts, and a facing surface S22 that faces the main board 30 (the mounting surface S31).

The base material 21 is, for example, a substrate whose main component is resin. Therefore, the base material 21 can also be called a resin substrate. In the sub-board 20, a wiring pattern or the like may be provided on the base material 21.

The facing surface lands 22 are provided at multiple locations of the facing surface S22. Therefore, it can be said that the sub-board 20 includes multiple facing surface lands 22. The first solder 50 is electrically connected to the facing surface land 22.

The facing surface land 22 is provided for electrically connecting the sub-board 20 and the main board 30. That is, the sub-board 20 is electrically connected to the main board 30 by connecting the first solder 50 to the facing surface land 22. The facing surface land 22 corresponds to a facing surface electrode.

FIG. 4 is a plan view of the sub-board 20 on the facing surface 22S side. FIG. 4 illustrates a state in which the first solder 50 is connected to the facing surface land 22. The facing surface land 22 is provided at a position hidden behind the first solder 50.

In FIG. 4, the outline of the electronic component 10 is shown with a one-dot dashed line, and the semiconductor chip 11 and the reinforcing resin portion 40 are shown with a two-dot dashed line. FIG. 4 illustrates a position where the first solder 50 is removed, in other words, a position where the electrical connecting portion is not provided with a broken circle. In other words, the broken circle in FIG. 4 indicates a non-forming portion where the first solder 50 (electrical connecting portion) is not provided. The facing surface land 22 may also be provided in a region being opposite to the non-forming portion. The non-forming portion will be described in detail later. The electrical connecting portion described in the present disclosure may also be referred to as an electrical connector.

As illustrated in FIG. 2, the electronic component 10 mounts on the one surface S21 of the sub-board 20. Multiple lands are formed at the one surface S21 of the sub-board 20 to make an electrical connection with the electronic component 10. This land can also be called a one-sided land or one-sided electrode. The one-sided land is electrically connected to the facing surface land 22 via, for example, a wiring pattern. The second solder 70 is connected to one-sided land. The sub-board 20 is electrically connected to the electronic component 10 by connecting the second solder 70 to one-sided land.

The sub-board 20 may be provided with a component-side protective film so that the facing surface land 22 and one-sided land are exposed. The component-side protective film covers a portion of the base material 21 for the purpose of protection against adhesion of dust and damage. A portion of the base material 21 is a portion excluding the one-sided land on the one surface S21 side and a portion excluding the facing surface land 22 on the facing surface S22 side.

The facing surface land 22 or one-sided land functions as an electrode for an external connection by exposing the facing surface land 22 or one-sided land from the component-side protective film. It can also be said that the sub-board 20 has multiple one-sided lands exposed on the one surface S21 and multiple facing surface lands 22 exposed on the facing surface S22.

It is possible to adopt, as the sub-board 20, a module component including multiple semiconductor chips forming a system. The module component can also be called a system-on-chip (SoC) or a multi-chip module. Modular components tend to be larger than discrete components.

(Electronic Component)

As shown in FIG. 2, the electronic component 10 includes, for example, a semiconductor chip 11, a board 12 on which the semiconductor chip 11 mounts, a sealing resin portion 13 for sealing the semiconductor chip 11. The semiconductor chip 11 is formed in a bare chip. As shown in FIG. 4, the semiconductor chip 11 includes four side walls S11 and four corner portions C11.

The semiconductor chip 11 and the sealing resin portion 13 are arranged on one of the surfaces of the board 12. An electrode that is electrically connected to the semiconductor chip 11 at the other one of the surfaces of the board 12. The second solder 70 is electrically connected to this electrode. The electronic component 10 is electrically connected to the sub-board 20 through the second solder 70.

The electronic component 10 can adopt a discrete component. The discrete component is an electronic component provided with a single function, such as a MOSFETs, an IGBT, a diode, and resistive element.

(Reinforcing Resin Portion)

As shown in FIGS. 1, 2, the reinforcing resin portion 40 is provided so as to be in contact with the electronic component 10 and the one surface S21. The reinforcing resin portion 40 is made of mainly of resin. The reinforcing resin portion 40 corresponds to a reinforcing member.

The reinforcing resin portion 40 is in close contact with the side wall S11 of the electronic component 10, the corner portion C11, and one surface S21 of the sub-board 20. In other words, it can be said that the reinforcing resin portion 40 connects the electronic component 10 and the sub-board 20.

The semiconductor chip 11, the board 12, and the sealing resin portion 13 have different coefficients of linear expansion. Therefore, stress is generated in the second solder 70 and a portion connected to the second solder 70 due to a temperature change in a thermal cycle test or in an actual usage environment. The reinforcing resin portion 40 reduces stress applied to the second solder 70 and a portion connected to the second solder 70 by being in contact with both of the electronic component 10 and the one surface S21. The reinforcing resin portion 40 is a member for reinforcing the connection between the electronic component 10 and the sub-board 20. The stress to the second solder 70 and the like is likely to be applied to a facing region of the semiconductor chip 11, in particular, a position facing an edge portion of the semiconductor chip 11.

In the present embodiment, as an example, a reinforcing resin portion 40 provided over the entire circumference of the electronic component 10 is adopted. However, the reinforcing resin portion 40 is not only limited to the above example.

(Electrical Connecting Portion)

Figure 5:
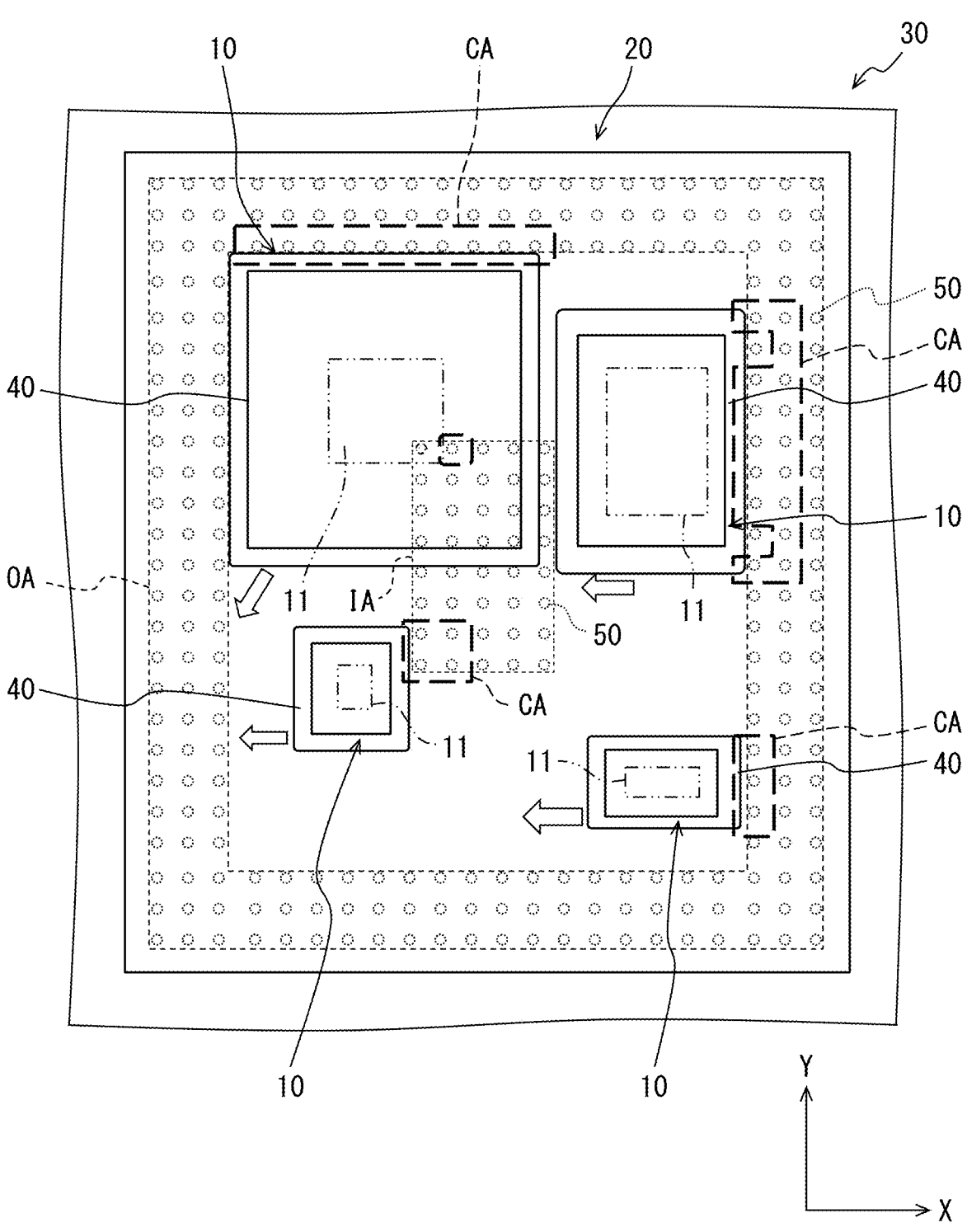
FIG. 5 is a plan view showing the schematic configuration of the electronic device according to the embodiment.
Figure 6:
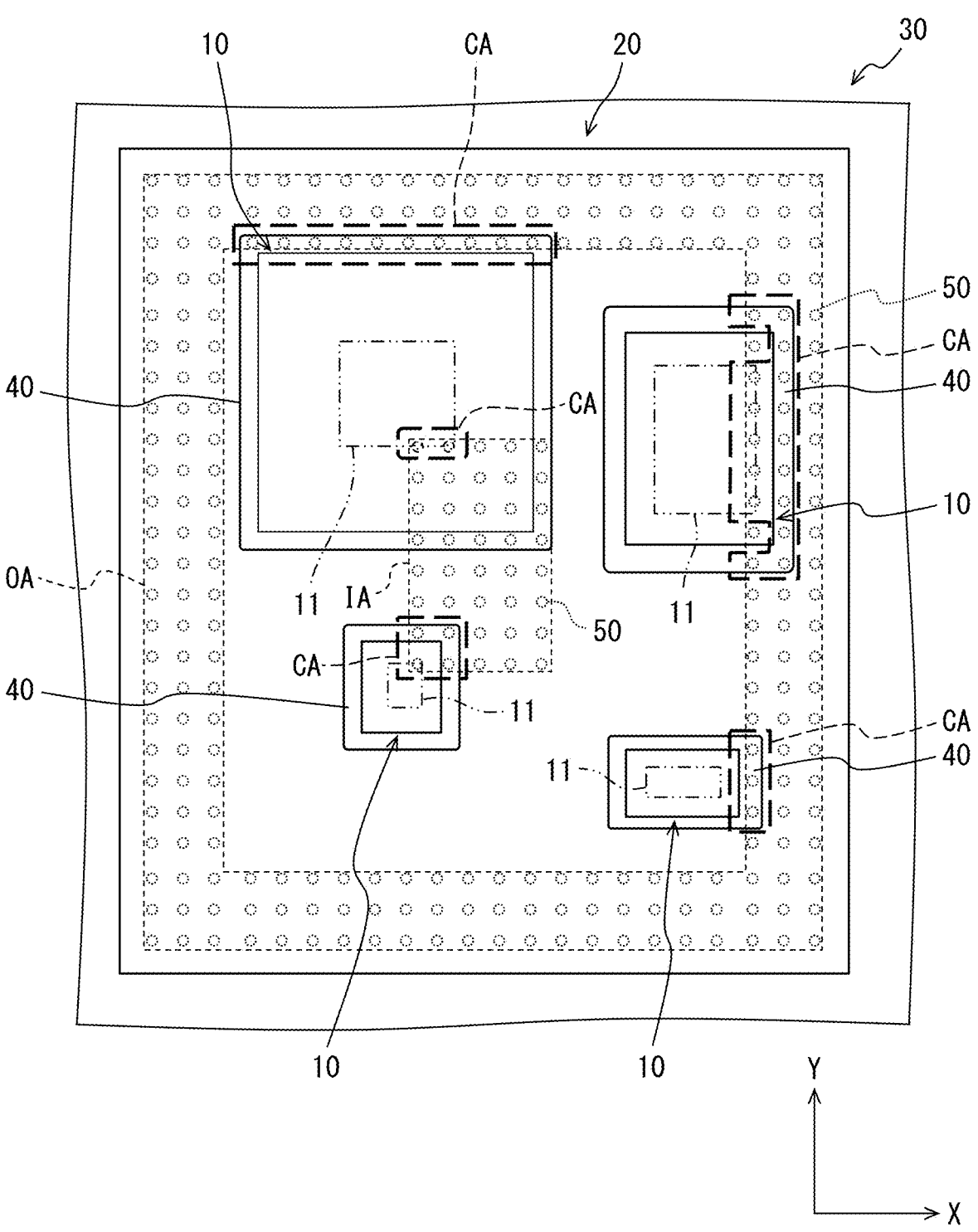
FIG. 6 is a plan view showing a schematic configuration of an electronic device according to a comparative example.

The following describes an electrical connecting portion with reference to FIGS. 2 to 6. The electrical connecting portion is a portion that contributes to electrical connection between the sub-board 20 and the main board 30. The electrical connecting portion includes the facing surface land 22 and the first solder 50. As described above, the electronic device 100 includes multiple facing surface lands 22 and multiple first solders 50. For this reason, the electronic device 100 includes multiple electrical connecting portions (or may also be referred to as electrical connectors). FIG. 2 illustrates a position where the first solder 50 is removed, in other words, a position where the electrical connecting portion is not provided with a broken circle. Each of FIGS. 5, 6 illustrates a position where the first solder 50 is provided, in other words, a position where the electrical connecting portion is provided with a dotted circle.

The facing surface land 22 as a portion of the electrical connecting portion is provided at the sub-board 20. The first solder 50, which is a section of the electrical connecting portion, is placed between the sub-board 20 and the main board 30. It can be said that at least a section of the electrical connecting portion is disposed between the sub-board 20 and the main board 30.

As shown in FIGS. 2, 3, and 4, the member facing portion FA, which is a region facing the reinforcing resin portion 40 and located between the sub-board 20 and the main board 30, is not provided with an electrical connecting portion. That is, each electrical connecting portion is provided at a position dislocated from the member facing portion FA. It can be said that each electrical connecting portion is located outside the member facing portion FA.

Therefore, in the member facing portion FA, the sub-board 20 and the main board 30 are not electrically connected. It can also be said that the member facing portion FA is provided with a non-forming portion. It can be said that each electrical connecting portion is provided around the member facing portion FA. It can be said that a non-molded portion is a region in the electrical connecting region where at least the first solder 50 is not formed.

The present embodiment adopts an example in which each electrical connecting portion is provided at a position dislocated from the member facing portion FA. In other words, all of the electrical connecting portions are entirely arranged at positions dislocated from the member facing portion FA. As illustrated in FIG. 3, the facing surface land 22 is arranged at a position dislocated from the member facing portion FA. Similarly, the first solder 50 is provided at a position dislocated from the member facing portion FA. The first solder 50 is not only a connecting portion connected to the facing surface land 22, but the first solder 50 is entirely dislocated from the member facing portion FA. In the present embodiment, the mounting surface land 32 is also provided at a position dislocated from the member facing portion FA.

As shown in FIG. 4, the reinforcing resin portion 40 is provided in a ring shape so as to surround the electronic component 10. The member facing portion FA has a ring shape. Therefore, in the electronic device 100, the non-forming region where no electrical connecting portion is provided is formed in a ring shape.

However, the present disclosure is not only limited to the above example. At least a section of each electrical connecting portion may be provided at a position dislocated from the member facing portion FA. In other words, all of the electrical connecting portions may include the one such that the entire electrical connecting portion is provided at a position dislocated from the member facing portion FA. In other words, all of the electrical connecting portions may include the one such that a section of the electrical connecting portion is provided at a position dislocated from the member facing portion FA. The electronic device 100 can adopt such a configuration.

As illustrated in FIGS. 2, 4, the present embodiment adopts an example in which each electrical connecting portion is provided at a position dislocated from an edge facing portion OP facing the edge portion of the semiconductor chip 11. It can be said that each electrical connecting portion is located outside the edge facing portion. Each electrical connecting portion is provided to overlap the edge facing portion OP. However, the present disclosure is not only limited to the above example. The electrical connecting portion may be provided on the edge facing portion OP. The edge portion of the semiconductor chip 11 can also be called the outer periphery of the semiconductor chip 11 or the contour of the semiconductor chip 11.

The electrical connecting portion may include the mounting surface land 32. The electrical connecting portion may include only one of the facing surface land 22 and the first solder 50.

The following describes a method of arranging the electrical connecting portion at a position dislocated from the member facing portion FA with reference to FIGS. 5, 6. As illustrated in FIGS. 5, 6, the main board 30 in which the facing surface lands 22 are provided in the central region IA and the outer peripheral region OA is adopted. The outer peripheral region OA is a ring-shaped region provided at the edge of the facing surface S22. The central region IA is a region surrounded by the outer peripheral region OA. The facing surface lands 22 are provided in each of the central region IA and the outer peripheral region OA.

For the simplification of the drawings, each of FIGS. 5, 6 omits the illustration of the facing surface land 22 and the mounting surface land 32. However, the facing surface land 22 and the mounting surface land 32 are provided at positions facing the first solder 50.

FIG. 6 illustrates an electronic device according to a comparative example in which the electronic component 10 mounts on the sub-board 20 without considering the positions of the member facing portion FA and the electrical connecting portion. In this case, as shown by the broken line CA, some of the electrical connecting portions are arranged in a region facing the reinforcing resin portion 40 or in a position facing the edge portion of the semiconductor chip 11. The broken line CA indicates a concerned region. The concerned region CA is a region where the connection reliability of the electrical connecting portion is an issue.

In other words, the concerned region CA is a region where stress is likely to occur in the electrical connecting portion due to a temperature change as described above. The stress generated in the second solder 70 is likely to be applied via the sub-board 20 to the facing region of the semiconductor chip 11, particularly to the electrical connecting portion at a position facing the edge portion of the semiconductor chip 11. Furthermore, stress is likely to be applied to the electrical connecting portion in the facing region of the reinforcing resin portion 40 via the sub-board 20 due to curing shrinkage (deformation) of the reinforcing resin portion 40 because of the temperature change.

On the other hand, FIG. 5 illustrates an electronic device 100 in which the electronic component 10 mounts on the sub-board 20 in consideration of the positions of the member facing portion FA and the electrical connecting portion. The electronic components 10 are mounted offset as shown by the white arrows. That is, in the electronic device 100, the electronic component 10 mounts such that the reinforcing resin portion 40 and the edge portion of the semiconductor chip 11 are not placed in the concerned region CA. Accordingly, in the electronic device 100, the electrical connecting portion is provided at a position dislocated from the member facing portion FA. Furthermore, the electronic device 100 is provided with an electrical connecting portion at a position dislocated from the edge facing portion OP. The arrangement method described in the present disclosure is merely an example. The present disclosure is not limited to this example.

Advantageous Effects

In the electronic device 100, stress is applied to the sub-board 20 as the reinforcing resin portion 40 deforms due to the temperature change. In a configuration in which an electrical connecting portion is provided in the member facing portion FA, stress is also applied to the electrical connecting portion via the sub-board 20.

However, at least a section of each electrical connecting portion is provided at a position dislocated from the member facing portion FA. It can be also said that at least a section of each electrical connecting portion is located outside the member facing portion FA. Therefore, the electronic device 100 can suppress the stress from the reinforcing resin portion 40 from being applied to the electrical connecting portion. Accordingly, the electronic device 100 can suppress distortion of the electrical connecting portion. Therefore, the electronic device 100 can suppress a situation in which cracks or the like occur in the facing surface land 22 or the first solder 50 and lead to poor connection of the electrical connecting portion.

Therefore, the electronic device 100 can suppress a decrease in the reliability of the electrical connection between the sub-board 20 and the main board 30. In other words, the electronic device 100 can suppress a decrease in electrical connection reliability between the sub-board 20 and the main board 30 as compared with a configuration in which some of the electrical connecting portions are entirely disposed in the member facing portion FA. It can be said that the electronic device 100 can improve the reliability of the thermal cycle of the electrical connecting portion. The electronic device 100 can also suppress the application of stress to portions of the sub-board 20 and the main board 30 that are different from the electrical connecting portions.

In particular, the embodiment adopts an example in which each electrical connecting portion is entirely provided at a position dislocated from the member facing portion FA. Therefore, the electronic device 100 can suppress stress applied to the electrical connecting portion, as compared with a configuration in which a section of the electrical connecting portion is provided at the member facing portion FA.

The present embodiment adopts an example in which the facing surface land 22 is provided at a position dislocated from the member facing portion FA in each electrical connecting portion. In the electronic device 100, if at least the facing surface land 22 is provided at a position dislocated from the member facing portion FA, it is possible to suppress the occurrence of a connection fault in the electrical connecting portion.

Further, in the electronic device 100, each electrical connecting portion is provided at a position dislocated from the edge facing portion OP. Therefore, the electronic device 100 can further suppress a decrease in the reliability of the electrical connection between the sub-board 20 and the main board 30.

The preferred embodiment of the present disclosure has been described above. However, the present disclosure is not limited to the above embodiment. Various modifications may be made without departing from the scope and spirit of the present disclosure. First to eleventh modifications will be described as the other embodiments in the following. The first to the eleventh modifications mainly describe features different from the above embodiment and other modifications. The above-mentioned embodiment and the first to the eleventh modifications can be implemented independently, but they can be suitably combined and implemented. The present disclosure can be performed by various combinations without being limited to the combination described in the embodiments.

First Modification

Figure 7:
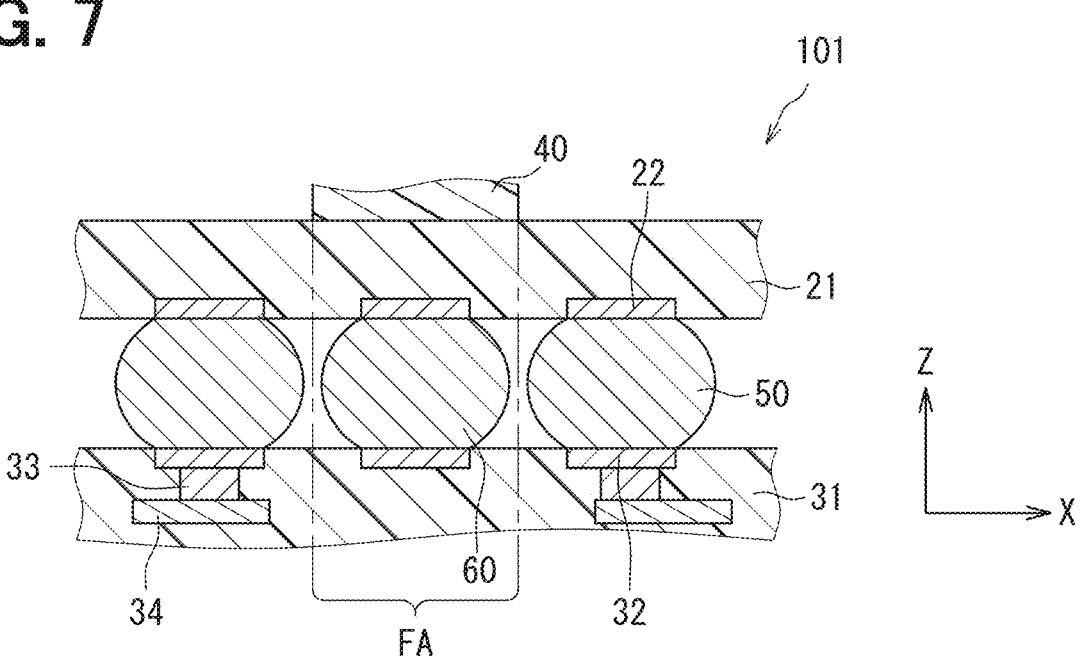
FIG. 7 is a cross-sectional view illustrating a schematic configuration of an electronic device of a first modification.

The following describes an electronic device 101 according to a first modification with reference to FIG. 7. The electronic device 101 has a different configuration in the member facing portion FA.

In the electronic device 101, at least a section of each electrical connecting portion is provided at a position dislocated from the member facing portion FA. As shown in FIG. 7, in the electronic device 101, dummy solder 60 is provided at the member facing portion FA. The dummy solder 60 mechanically connects sub-board 20 and main board 30. More specifically, the dummy solder 60 is connected to the facing surface land 22 and the mounting surface land 32. However, the facing surface land 22 to which the dummy solder 60 is connected is electrically insulated from another facing surface land 22 and the wiring pattern. Similarly, the mounting surface land 32 to which the dummy solder 60 is connected is electrically insulated from the other wiring portions 32 to 34. Therefore, the dummy solder 60 mechanically connects the sub-board 20 and the main board 30, but does not electrically connect them. In other words, the dummy solder 60 is a connecting portion that does not contribute to the electrical connection between the sub-board 20 and the main board 30.

The electronic device 101 can have effects similar to the effects of the electronic device 100. Since the electronic device 101 is provided with the dummy solder 60, the mechanical connection strength between the sub-board 20 and the main board 30 can be enhanced as compared with the electronic device 100.

The dummy solder 60 may be provided in regions other than the member facing portion FA. For example, the dummy solder 60 may be provided on the edge facing portion OP. The dummy solder 60 corresponds to a mechanical connecting portion or a mechanical connector.

Second Modification

Figure 8:
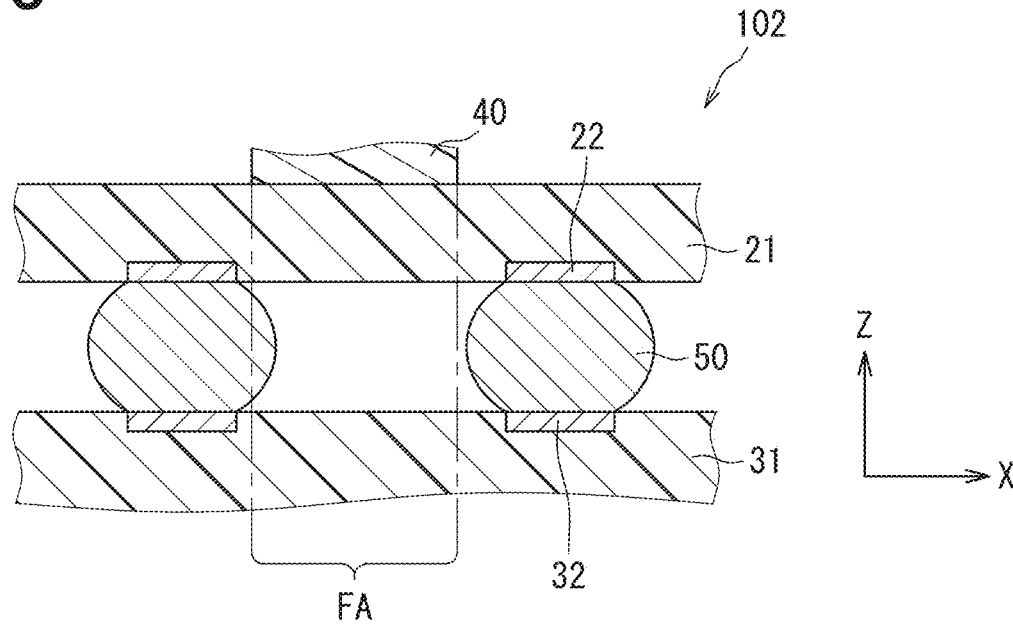
FIG. 8 is a cross-sectional view illustrating a schematic configuration of an electronic device of a second modification.

The following describes an electronic device 102 according to a second modification with reference to FIG. 8. The electronic device 102 is different from the electronic device 100 in the configuration of the electrical connecting portion.

As shown in FIG. 8, in the electronic device 102, a section of the first solder 50 is disposed at the member facing portion FA. Specifically, the first solder 50 includes a portion that is not connected to the facing surface land 22 and the mounting surface land 32. The above-mentioned portion is disposed at the member facing portion FA. However, each electrical connecting portion is provided at a position where the facing surface land 22 is dislocated from the member facing portion FA. Thus, at least a section of each electrical connecting portion may be provided at a position dislocated from the member facing portion FA. As similar to the electronic device 100, the electronic device 102 can suppress a decrease in electrical connection reliability between the sub-board 20 and the main board 30 as compared with a configuration in which some of the electrical connecting portions are entirely disposed in the member facing portion FA.

Third Modification

Figure 9:
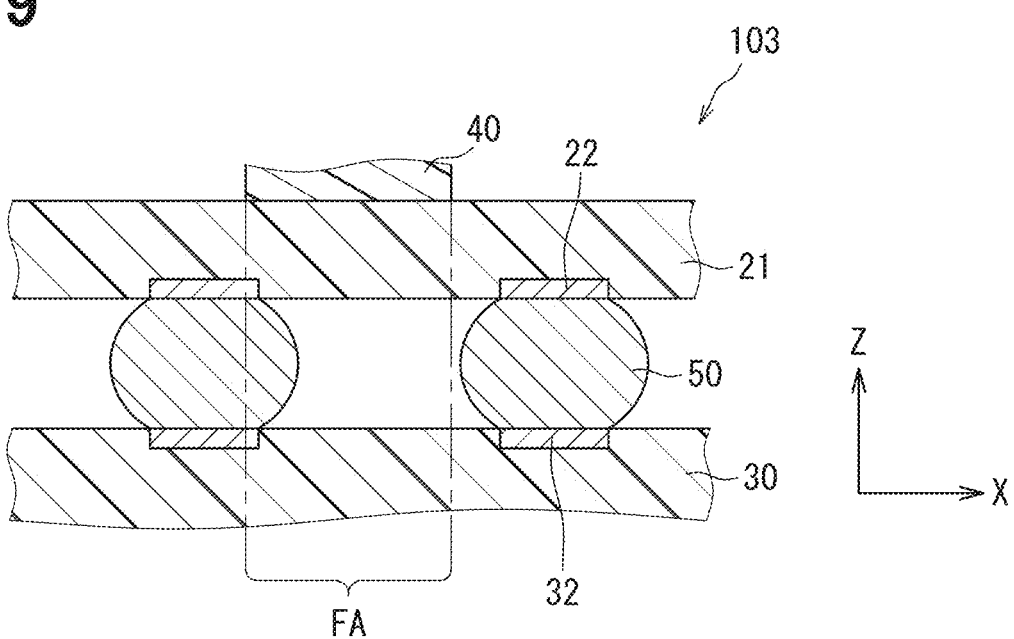
FIG. 9 is a cross-sectional view illustrating a schematic configuration of an electronic device of a third modification.

The following describes an electronic device 103 according to a third modification with reference to FIG. 9. The electronic device 103 is different from the electronic device 100 in the configuration of the electrical connecting portion.

As shown in FIG. 9, in the electronic device 103, the facing surface land 22 and a portion of the first solder 50 are arranged at the member facing portion FA. Thus, at least a section of each electrical connecting portion may be provided at a position dislocated from the member facing portion FA. As similar to the electronic device 100, the electronic device 103 can suppress a decrease in electrical connection reliability between the sub-board 20 and the main board 30 as compared with a configuration in which some of the electrical connecting portions are entirely disposed in the member facing portion FA.

Fourth Modification

Figure 10:
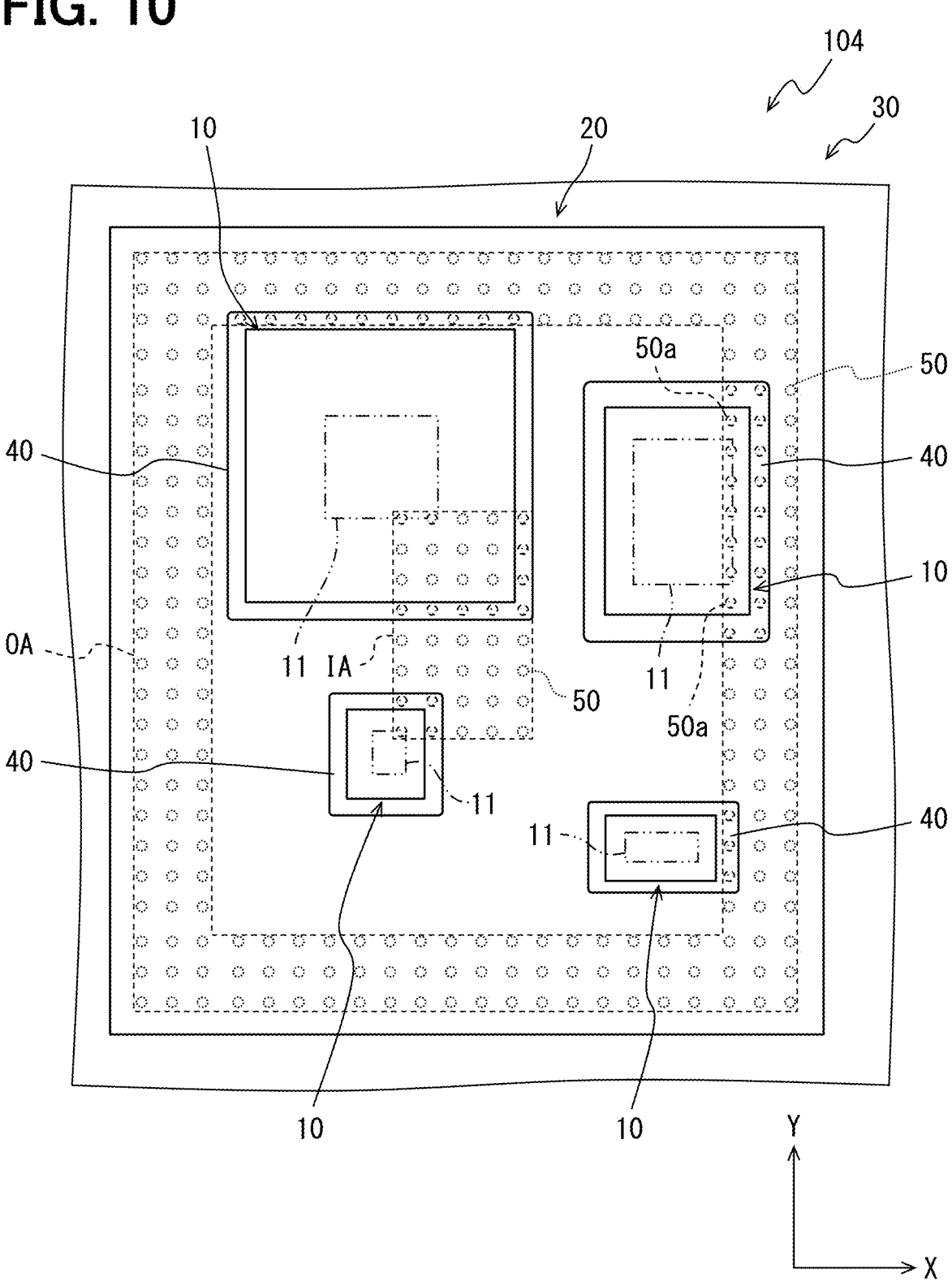
FIG. 10 is a plan view showing a schematic configuration of a electronic device according to a fourth modification.

The following describes an electronic device 104 according to a fourth modification with reference to FIG. 10. The electronic device 104 is different from the electronic device 100 in the configuration of the electrical connecting portion. FIG. 10 is a plan view corresponding to FIG. 5. FIG. 10 illustrates, with a hatching dotted circle, a position where the first solder 50 is removed, in other words, a position where the electrical connecting portion is not provided.

As shown in FIG. 10, in the electronic device 104, the electrical connecting portion is provided at a position dislocated from the region between the member facing portion FA and the edge facing portion OP, in addition to the position dislocated from the member facing portion FA and the position dislocated from the edge facing portion OP. A non-forming region 50a is a region between the member facing portion FA and the edge facing portion OP. In the non-forming region 50a, no electrical connecting portion is provided. It can be said that the electronic device 104 is provided with the non-forming region 50a.

The stress due to the temperature change is easily applied to the region between the member facing portion FA and the edge facing portion OP, as similar to the member facing portion FA and the edge facing portion OP. However, since the electronic device 104 is provided with the non-forming region 50a, it is possible to suppress a decrease in the reliability of the electrical connection between the sub-board 20 and the main board 30 as compared with the electronic device 100.

Fifth Modification

Figure 11:
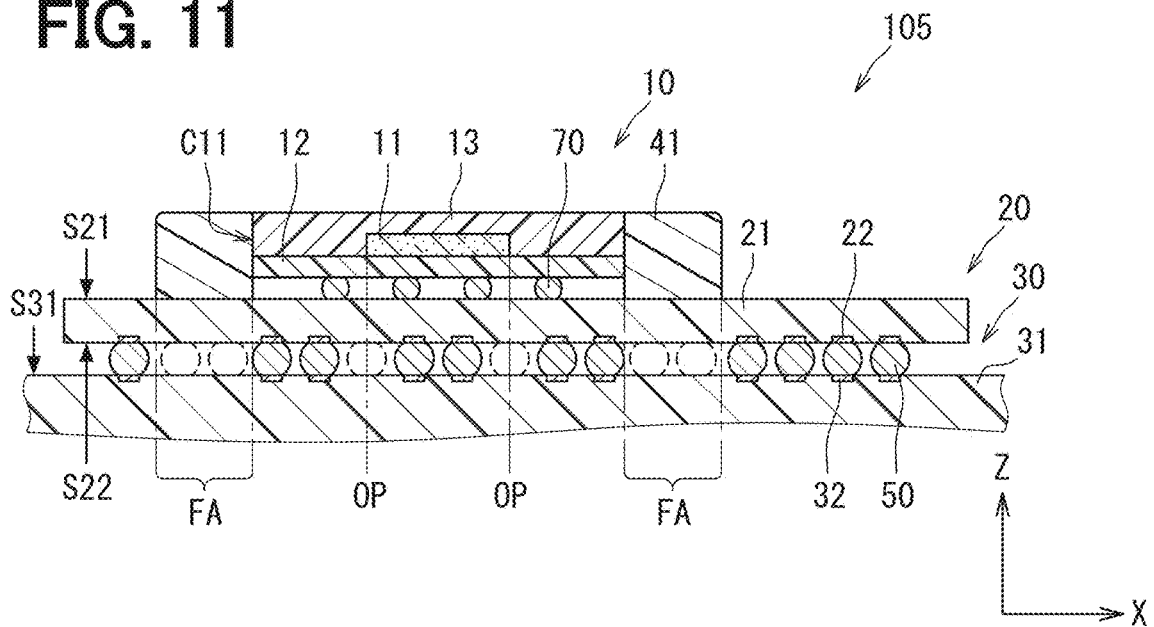
FIG. 11 is a cross-sectional view illustrating a schematic configuration of an electronic device according to a fifth modification.
Figure 12:
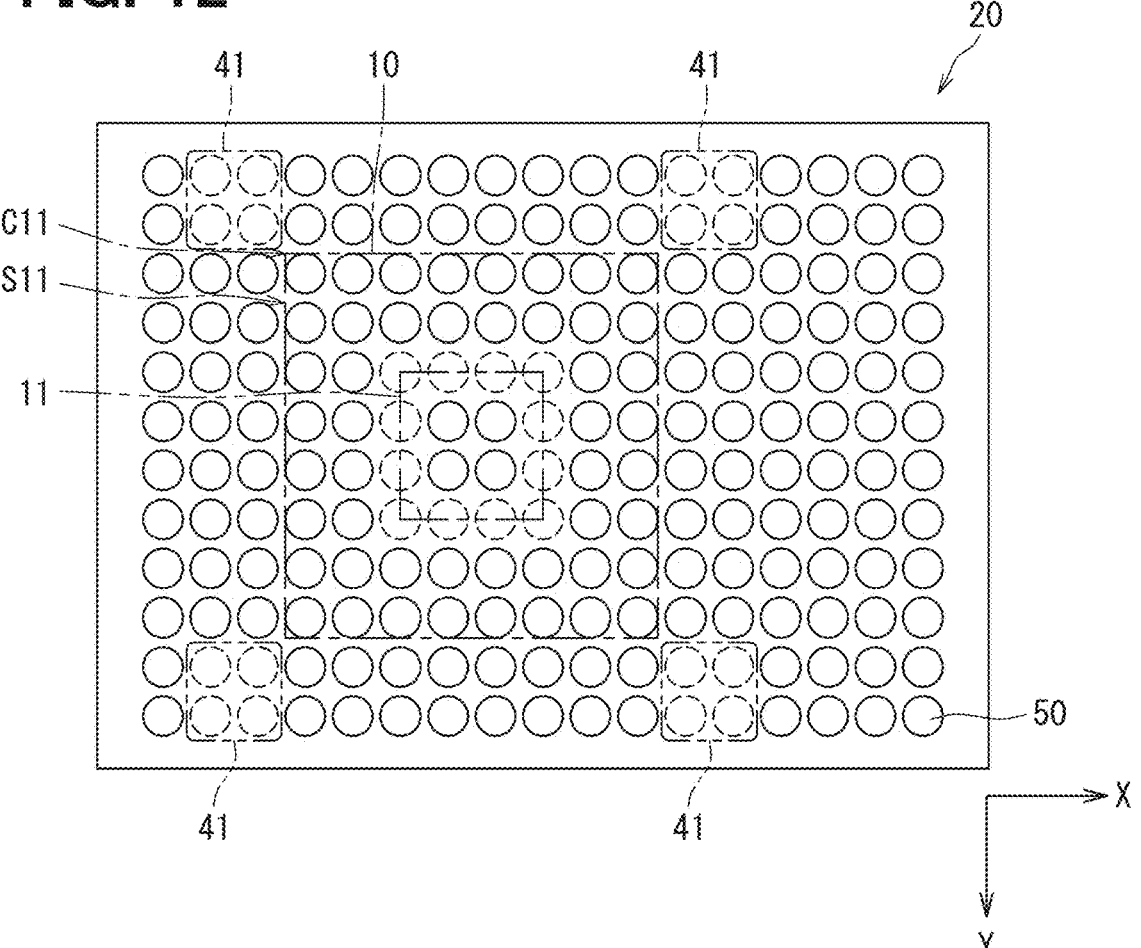
FIG. 12 is a plan view showing a schematic configuration of a sub-board according to the fifth modification on a facing surface side.

The following describes an electronic device 105 according to a fifth modification with reference to FIGS. 11, 12. The electronic device 105 is different from the electronic device 100 in the configuration of the reinforcing resin portion 41. FIG. 11 is a cross sectional view of an electronic device 109 passing through two reinforcing resin portions 41 and the electronic component 10 adjacent to each other in the X-direction. FIG. 12 is a plan view corresponding to FIG. 4.

As shown in FIGS. 11, 12, the reinforcing resin portion 41 is in contact with a corner portion C11 of the electronic component 10 and the one surface S21 of the sub-board 20. That is, unlike the reinforcing resin portion 40, the reinforcing resin portion 41 is provided to face the corner portion C11 of the electronic component 10. The reinforcing resin portion 41 can also be called a corner bond. The electronic device 104 can have effects similar to the effects of the electronic device 100.

Sixth Modification

Figures 13, 14:
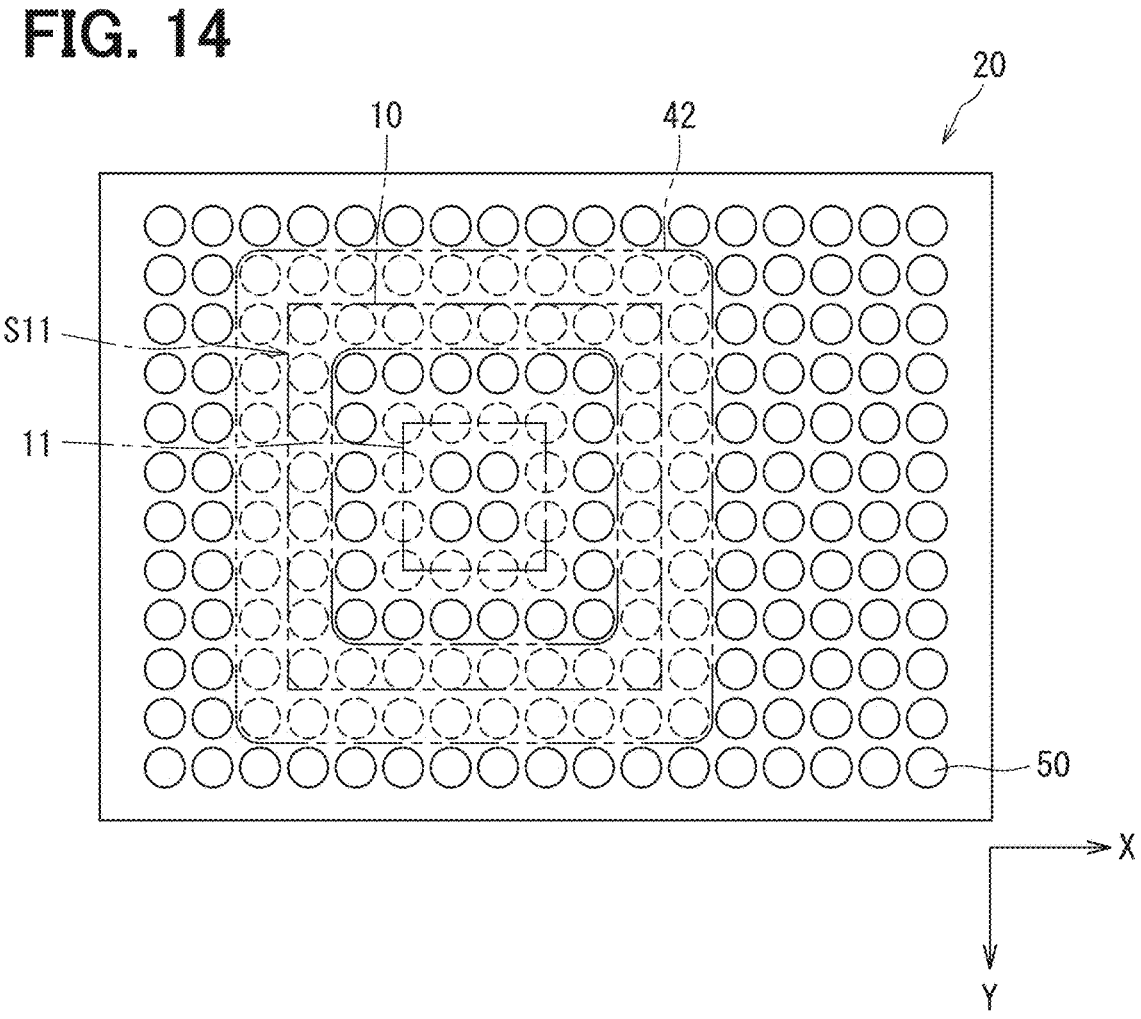
FIG. 13 is a cross-sectional view illustrating a schematic configuration of an electronic device of a sixth modification.
FIG. 14 is a plan view showing a schematic configuration of a sub-board according to the sixth modification on a facing surface side.

The following describes an electronic device 106 according to a sixth modification with reference to FIGS. 13, 14. The electronic device 106 is different from the electronic device 100 in the configuration of the reinforcing resin portion 41. FIG. 13 is a cross-sectional view corresponding to FIG. 2. FIG. 14 is a plan view corresponding to FIG. 4.

As shown in FIGS. 13, 14, the reinforcing resin portion 42 is in contact with the side wall S11 of the electronic component 10, the corner C11, and the one surface S21 of the sub-board 20. The reinforcing resin portion 42 is also in contact with the surface of the electronic component 10 that faces the one surface S21. Therefore, the reinforcing resin portion 42 is also provided between the electronic component 10 and the one surface S21. The reinforcing resin portion 42 can also be called an underfill. The electronic device 106 can have effects similar to the effects of the electronic device 100.

Seventh Modification

Figure 15:
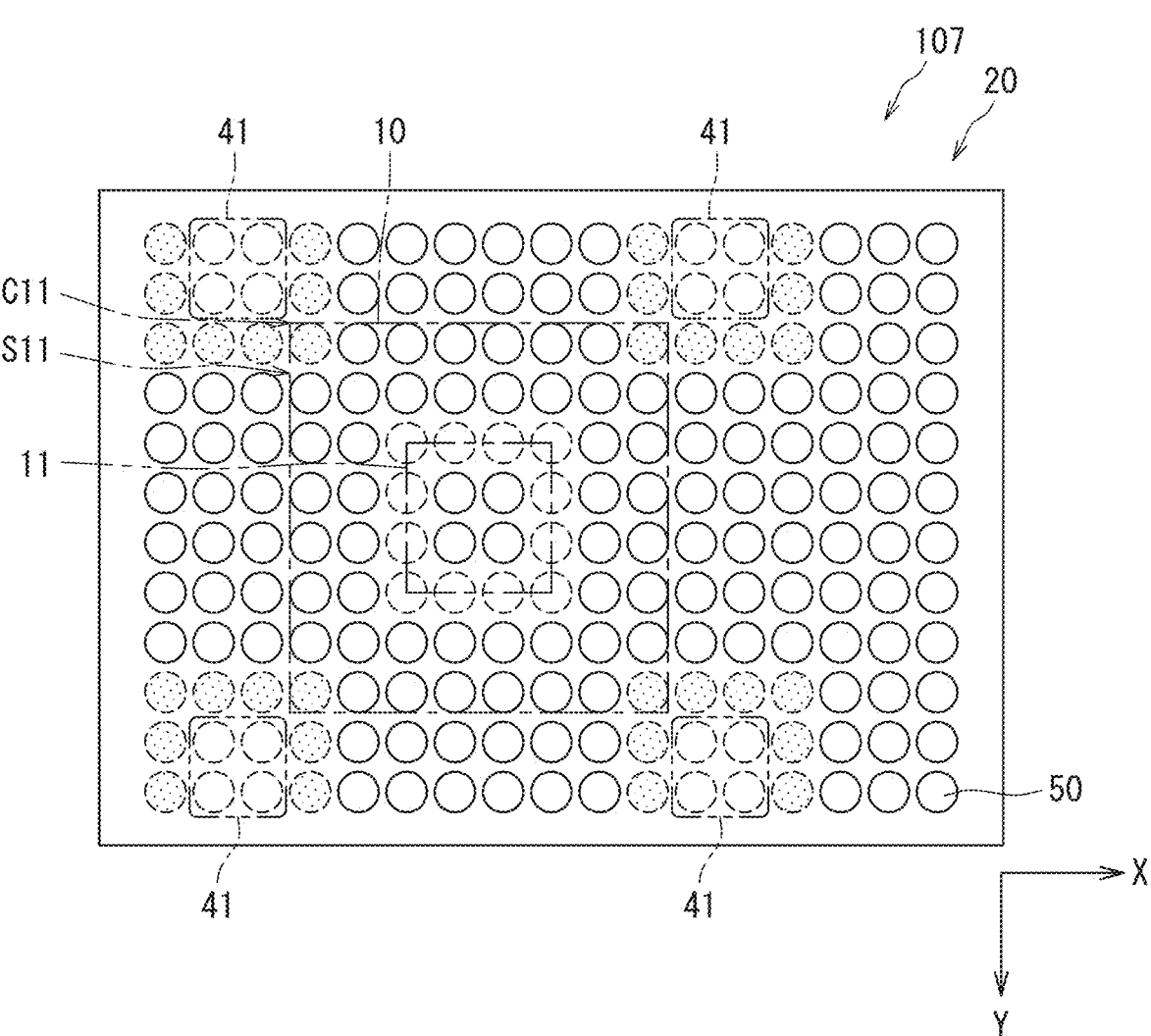
FIG. 15 is a plan view showing a schematic configuration of a sub-board according to a seventh modification on a facing surface side.

The following describes an electronic device 107 according to a seventh modification with reference to FIG. 15. The electronic device 107 is different from the electronic device 105 in the configuration of the electrical connecting portion. FIG. 15 is a plan view corresponding to FIG. 12. In FIG. 15, portions of the electronic device 105 that have been modified are indicated by hatching dotted circles. The modified location is a location where the first solder 50 is removed, that is, a location where no electrical connecting portion is provided.

As shown in FIG. 15, in the electronic device 107, each electrical connecting portion is disposed at a position dislocated from the member facing portion FA and the surrounding of the member opposing member FA. The periphery of the member facing portion FA is not the gap between the electrical connecting portions. The periphery of the member facing portion FA is, for example, a region between the facing surface land 22 adjacent to the member facing portion FA and the mounting surface land 32 opposing to the facing surface land. Further, the periphery of the member facing portion FA may be a region facing the mounting surface land 32 adjacent to the member facing portion FA.

The stress caused by the deformation of the reinforcing resin portion 40 as described above may reach not only the member facing portion FA but also the periphery of the member facing portion FA. The electronic device 107 is provided with electrical connecting portions not only at the member facing portion FA but also at positions dislocated from the periphery of the member facing portion FA. Therefore, the electronic device 107 can further suppress decrease in the reliability of the electrical connection between the sub-board 20 and the main board 30 as compared with the electronic device 105. Each electrical connecting portion may be provided at least partially at a position dislocated from the member facing portion FA and the periphery of the member facing portion FA.

Eighth Modification

Figure 16:
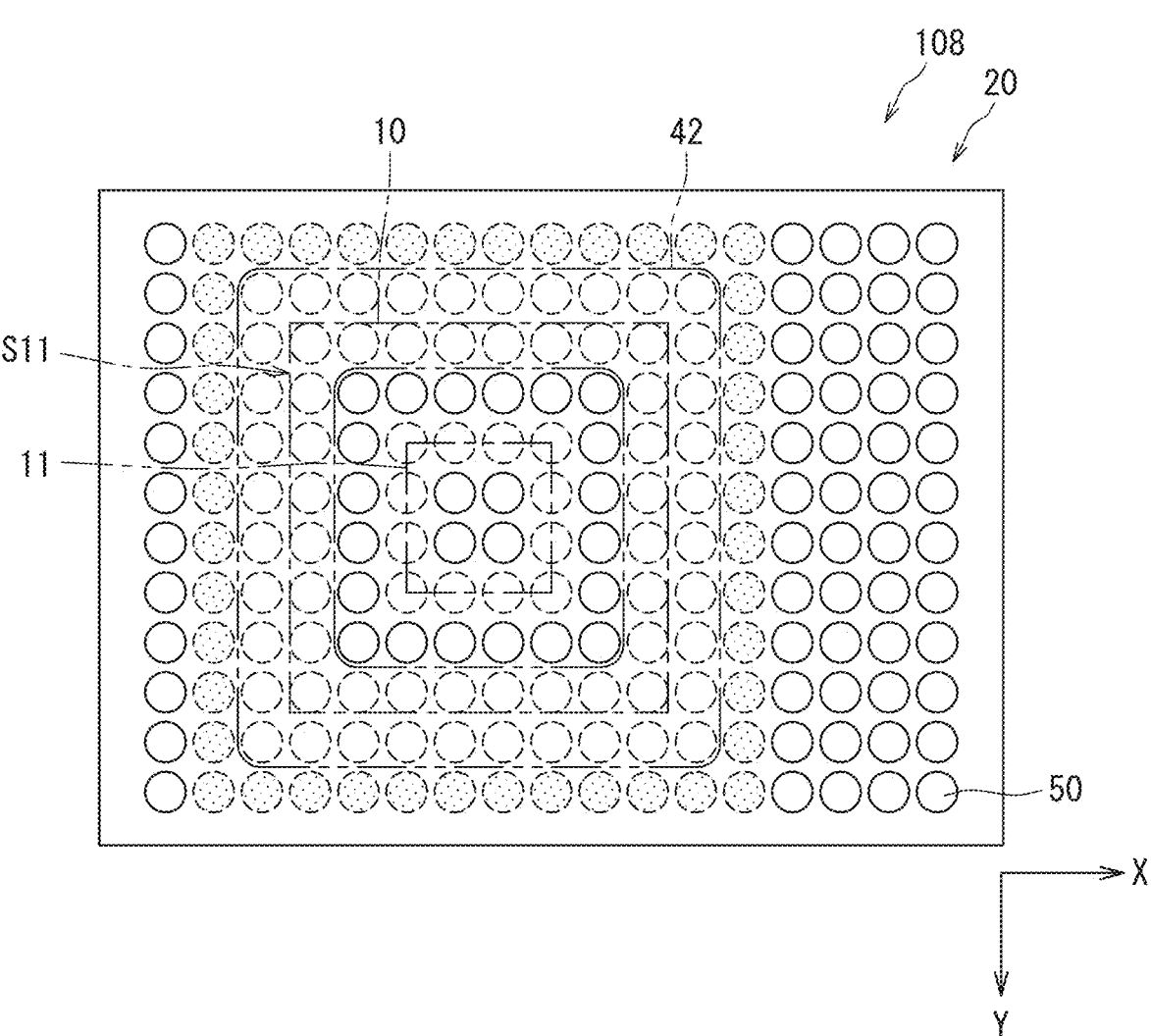
FIG. 16 is a plan view showing a schematic configuration of a sub-board according to an eighth modification on a facing surface side.

The following describes an electronic device 108 according to an eighth modification with reference to FIG. 16. The electronic device 108 is different from the electronic device 106 in the configuration of the electrical connecting portion. FIG. 16 is a plan view corresponding to FIG. 14. In FIG. 16, portions of the electronic device 106 that have been modified are indicated by hatching dotted circles. The modified location is a location where the first solder 50 is removed, that is, a location where no electrical connecting portion is provided.

As shown in FIG. 16, the electronic device 108 is an example in which the configuration of the electronic device 107 is applied to the electronic device 106 using underfill as the reinforcing resin portion 42. In the electronic device 108, each electrical connecting portion is provided at a position dislocated from the member facing portion FA and the periphery of the member facing portion FA. The electronic device 108 can have effects similar to those of the electronic device 107.

Ninth Modification

The following describes an electronic device 109 according to a ninth modification with reference to FIGS. 17, 18. The electronic device 109 is different from the electronic device 100 in the configuration of the electrical connecting portion. FIG. 17 is a cross-sectional view corresponding to FIG. 11. FIG. 18 is a plan view corresponding to FIG. 12.

As shown in FIG. 17, the electronic device 109 uses a connection pin 51 instead of the first solder 50. The connection pin 51 protrudes from the sub-board 20 (base material 21). The connection pin 51 is electrically connected to the second solder 70 via, for example, a wiring pattern. The reference numeral 22a indicates a root portion of the connection pin 51.

The main board 30 includes a through electrode 32a into which the connection pin 51 is inserted and electrically connected to the connection pin 51. The main board 30 includes a through electrode 32a, an interlayer connecting portion 33, and a wiring layer 34, each of which is a wiring portion. In this way, the electronic device 109 includes the connection pin 51 as an electrical connecting portion. The electrical connecting portion may include the through electrode 32a.

As shown in FIG. 18, each electrical connecting portion is provided at a position dislocated from the member facing portion FA, similarly to the electronic device 100. Moreover, each electrical connecting portion is provided at a position dislocated from the edge facing portion OP. It can be said that each electrical connecting portion is provided outside the edge facing portion OP. The electronic device 109 can have effects similar to the effects of the electronic device 100.

Each electrical connecting portion may be provided at least partially at a position dislocated from the member facing portion FA. It can be said that each electrical connecting portion may be provided at least partially outside the member facing portion FA. The ninth modification can be applied to the embodiment and its modifications. That is, in the above embodiment and its other modifications, the connection pin 51 can be used instead of the first solder 50. When the ninth modification is applied to the first modification, a dummy pin can be used instead of the dummy solder 60. Like the dummy solder 60, the dummy pin is a pin to which no electrical connection is made.

Tenth Modification

Figure 19:
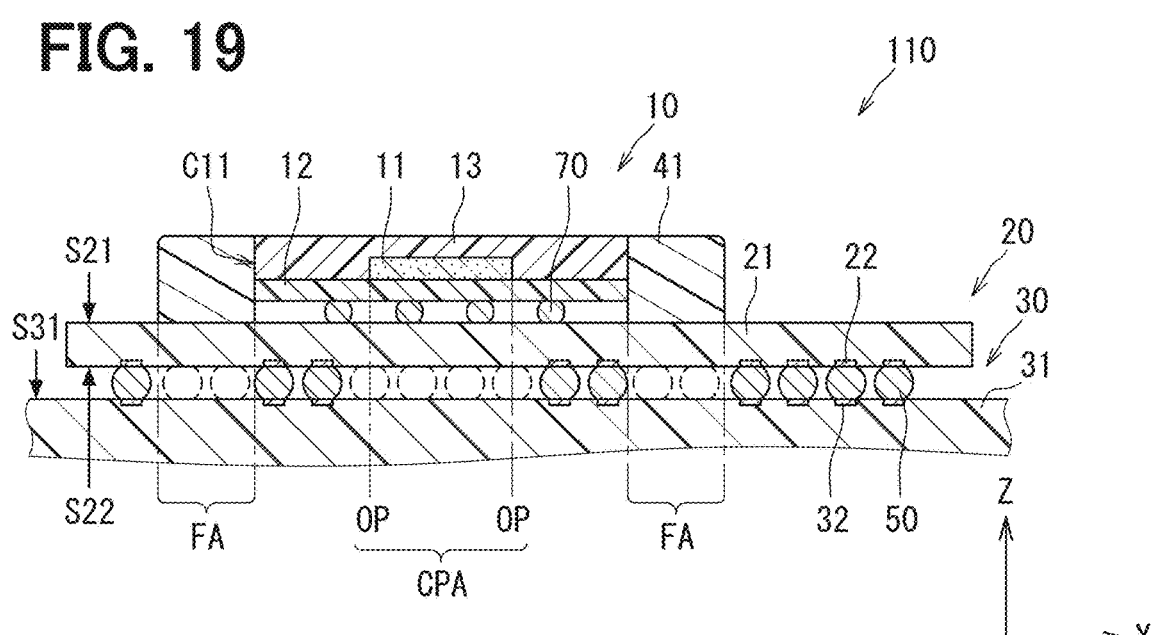
FIG. 19 is a cross-sectional view illustrating a schematic configuration of an electronic device according to a tenth modification.
Figure 20:
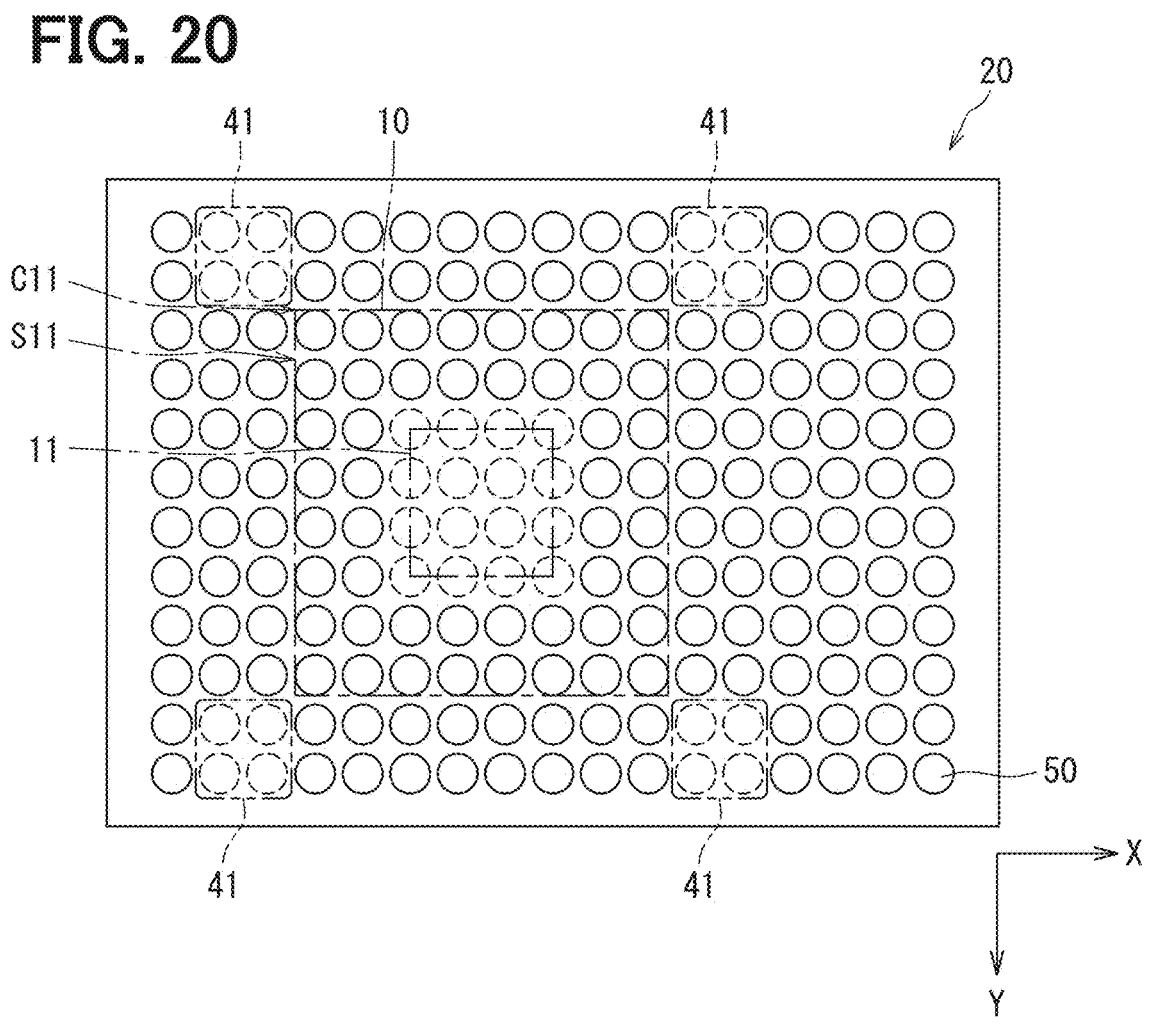
FIG. 20 is a plan view showing a schematic configuration of a sub-board according to the tenth modification on a facing surface side.

The following describes an electronic device 110 according to a tenth modification with reference to FIGS. 19, 20. The electronic device 110 is different from the electronic device 105 in the configuration of the electrical connecting portion. FIG. 19 is a cross-sectional view corresponding to FIG. 2. FIG. 20 is a plan view corresponding to FIG. 4.

As shown in FIGS. 19, 20, in the electronic device 110, each electrical connecting portion is provided at a position dislocated from a chip facing portion CPA, which is a region facing the semiconductor chip 11. It can be said that each electrical connecting portion is located outside the chip facing portion CPA. In other words, each electrical connecting portion is provided at a position dislocated not only from the edge facing portion OP but also from the chip facing portion CPA, which is the entire facing region facing the semiconductor chip 11.

The electronic device 110 can have effects similar to the effects of the electronic device 105. The electronic device 110 can further suppress decrease in the reliability of the electrical connection between the sub-board 20 and the main board 30 as compared with the electronic device 105.

Eleventh Modification

Figure 21:
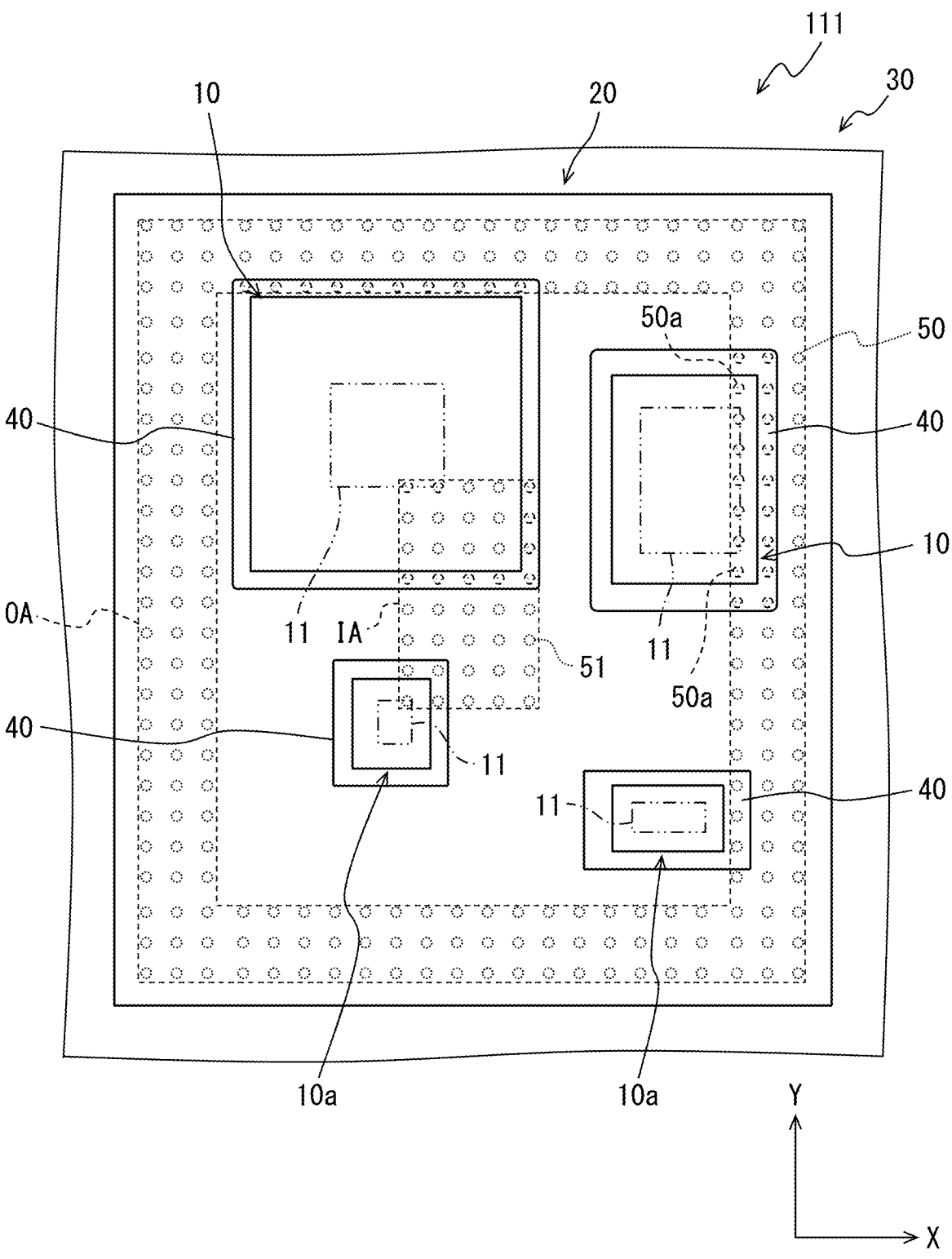
FIG. 21 is a plan view showing a schematic configuration of an electronic device according to an eleventh modification.

The following describes an electronic device 111 according to an eleventh modification with reference to FIG. 21. The electronic device 111 is different from the electronic device 100 in the configuration of the electrical connecting portion. FIG. 21 illustrates, with a hatching dotted circle, a position where the first solder 50 is removed, in other words, a position where the electrical connecting portion is not provided.

As shown in FIG. 21, in the electronic device 111, the electronic component 10 and a small electronic component 10a mount on the sub-board 20. The small electronic component 10a has a smaller physical size than the electronic component 10. Therefore, the electronic component 10 may also be referred to as a large electronic component 10. For example, the length of each side of the large electronic component 10 is 5 millimeters or larger. In contrast, the length of each side of the small electronic component 10a is smaller than 5 millimeters. The sides described above are a side in the X-direction and a side in the Y-direction.

FIG. 21 illustrates an example in which the electronic device 111 includes two large electronic components 10 and two small electronic components 10a. However, the number of the large electronic components 10 and the number of the small electronic components 10a are not limited to the above example.

The small electronic component 10a has less influence on the electrical connecting portion due to the temperature change than the large electronic component 10. Therefore, in the electronic device 111, the electrical connecting portions may be arranged as described above only for the large electronic component 10.

In the electronic device 111, no electrical connecting portion is provided at the member facing portion FA, which is a region facing the reinforcing resin portion 40 provided at the large electronic component 10. The electrical connecting portion is provided at a position dislocated from the member facing portion FA, which is the facing region of the reinforcing resin portion 40 provided at the large electronic component 10. In the electronic device 111, the electrical connecting portion is provided at the member facing portion FA, which is a region opposing to the reinforcing resin portion 40 provided at the small electronic component 10a.

In the electronic device 111, the electrical connecting portion is not provided at the edge facing portion OP that faces the edge portion of the semiconductor chip 11 of the large electronic component 10. That is, the electrical connecting portion is provided at a position dislocated from the edge facing portion OP that opposes to the edge portion of the semiconductor chip 11 of the large electronic component 10. In contrast, in the electronic device 111, the electrical connecting portion is provided at the edge facing portion OP that faces the edge portion of the semiconductor chip 11 of the small electronic component 10a.

The electrical connecting portion may be provided at a position dislocated from the chip facing portion CPA that faces the semiconductor chip 11 of the large electronic component 10. The electrical connecting portion may be provided at the chip facing portion CPA that faces the semiconductor chip 11 of the small electronic component 10a. Furthermore, at least a section of each electrical connecting portion may be provided at a position dislocated from the member facing portion FA.

The electronic device 111 can have effects similar to the effects of the electronic device 100. The small electronic component 10a may not be reinforced by the reinforcing resin portion 40.

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. An electronic device comprising:
a first circuit component;
a second circuit component including a surface on which the first circuit component mounts, the second circuit component electrically connected to the first circuit component;
a reinforcing member including resin, the reinforcing member being in contact with the first circuit component and the surface of the second circuit component, the reinforcing member reinforcing a connection between the first circuit component and the second circuit component;
a third circuit component having a mounting surface on which the second circuit component mounts, the third circuit component electrically connected to the second circuit component; and
a plurality of electrical connectors configured to establish an electrical connection between the second circuit component and the third circuit component, at least one section of each of the plurality of electrical connectors being located between the second circuit component and the third circuit component, wherein:
at least one section of each of the plurality of electrical connectors is located outside a member facing portion; and
the member facing portion is a region between the second circuit component and the third circuit component and facing the reinforcing member.

2. The electronic device according to claim 1,
wherein an entire section of each of the plurality of electrical connectors is located outside the member facing portion.

3. The electronic device according to claim 1, wherein:
the surface of the second circuit component is a first surface;
the second circuit component further includes a second surface opposite from the first surface and facing the mounting surface of the third circuit component;
each of the plurality of electrical connectors includes a facing surface electrode and a solder ball;
the facing surface electrode is located at the second surface;
the solder ball is electrically connected to the second surface; and
the facing surface electrode is located outside the member facing portion.

4. The electronic device according to claim 1, wherein:
the first circuit component includes a semiconductor chip;
each of the plurality of electrical connectors is located outside an edge facing portion; and
the edge facing portion is a region between the second circuit component and the third circuit component and facing an edge portion of the semiconductor chip.

5. The electronic device according to claim 1, wherein:
the first circuit component includes a semiconductor chip;
each of the plurality of electrical connectors is located outside a chip facing portion; and
the chip facing portion is a region between the second circuit component and the third circuit component and facing the semiconductor chip.

6. The electronic device according to claim 1,
each of the plurality of electrical connectors is located outside the member facing portion and periphery of the member facing portion.

7. The electronic device according to claim 1, further comprising:
a mechanical connector configured to mechanically connect the second circuit component and the third circuit component,
wherein the mechanical connector is provided in at least the member facing portion.

* * * * *